United States Patent
Morrison et al.

(10) Patent No.: US 10,656,233 B2
(45) Date of Patent: *May 19, 2020

(54) METHOD OF CALIBRATING IMPEDANCE MEASUREMENTS OF A BATTERY

(71) Applicants: Dynexus Technology, Inc., Niwot, CO (US); Montana Technological University, Butte, MO (US)

(72) Inventors: John L. Morrison, Butte, MO (US); William H. Morrison, Butte, MO (US)

(73) Assignee: Dynexus Technology, Inc., Loveland, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/432,822

(22) Filed: Jun. 5, 2019

(65) Prior Publication Data

US 2019/0302215 A1 Oct. 3, 2019

Related U.S. Application Data

(63) Continuation of application No. 15/497,142, filed on Apr. 25, 2017, now Pat. No. 10,436,873.

(60) Provisional application No. 62/331,730, filed on May 4, 2016, provisional application No. 62/326,923, filed on Apr. 25, 2016.

(51) Int. Cl.
 *G01R 35/00* (2006.01)
 *G01R 31/389* (2019.01)
 *G01R 31/367* (2019.01)

(52) U.S. Cl.
 CPC ......... *G01R 35/005* (2013.01); *G01R 31/367* (2019.01); *G01R 31/389* (2019.01)

(58) Field of Classification Search
 CPC .................................................. G01R 35/005
 See application file for complete search history.

(56) References Cited

U.S. PATENT DOCUMENTS

| 7,395,163 | B1 * | 7/2008 | Morrison | G01R 31/389 702/75 |
| 7,675,293 | B2 * | 3/2010 | Christophersen | G01R 31/367 324/613 |
| 7,688,036 | B2 * | 3/2010 | Yarger | H01M 6/5033 320/137 |

(Continued)

OTHER PUBLICATIONS

Morrison, W.H., Development and Implementation of a Calibration Procedure for Complex Impedance Spectrum Measurements with Applications to Embedded Battery Health Monitoring and Management Systems, University of Connecticut Master's Theses 353, 2012, digitalcommons.uconn.edu/gs_theses/353, Hartford, Connecticut.

(Continued)

*Primary Examiner* — Raymond L Nimox
(74) *Attorney, Agent, or Firm* — Craig R. Miles; CR Miles P.C.

(57) ABSTRACT

A method of calibration is described that simplifies the measurement of battery impedance conducted in-situ while determining battery state-of-health. A single shunt measurement with a known Sum of Sines (SOS) current, at the desired frequency spread and known root mean squared (RMS) current is used to create a calibration archive. A calibration selected from this archive is used to calibrate an impedance measurement made on the battery.

20 Claims, 19 Drawing Sheets

(56) References Cited

U.S. PATENT DOCUMENTS

| | | | |
|---|---|---|---|
| 8,150,643 B1* | 4/2012 | Morrison | G01R 31/389 |
| | | | 702/75 |
| 8,352,204 B2* | 1/2013 | Morrison | G01R 31/2837 |
| | | | 702/117 |
| 8,762,109 B2* | 6/2014 | Christophersen | G01R 31/389 |
| | | | 702/196 |
| 8,868,363 B2* | 10/2014 | Morrison | G01R 31/389 |
| | | | 702/63 |
| 9,244,130 B2 | 1/2016 | Morrison et al. | |
| 9,851,414 B2 | 12/2017 | Morrison et al. | |
| 2010/0274510 A1* | 10/2010 | Morrison | G01R 31/2837 |
| | | | 702/75 |
| 2011/0270559 A1* | 11/2011 | Christophersen | G01R 27/26 |
| | | | 702/65 |
| 2014/0358462 A1* | 12/2014 | Christophersen | G01R 31/389 |
| | | | 702/65 |
| 2016/0157014 A1* | 6/2016 | Van Schyndel | H04R 3/007 |
| | | | 381/55 |
| 2016/0157015 A1* | 6/2016 | Van Schyndel | H04R 3/007 |
| | | | 381/55 |
| 2016/0274060 A1* | 9/2016 | Denenberg | G01N 27/9046 |
| 2017/0003354 A1 | 1/2017 | Morrison et al. | |
| 2017/0254859 A1 | 9/2017 | Christophersen et al. | |

OTHER PUBLICATIONS

Naligo, A., Barendse, P., A comparison of the Different Broadband Impedance Measurement Techniques for Lithium-ion Batteries, IEEE Energy Conversion Congress and Exposition (ECCE), Sep. 2016.

Solartron Analytical, 1260A Impedance / Gain-Phase Analyzer (2017); Website, https://www.ameteksi.com, 2 pages, originally downloaded Apr. 19, 2019.

U.S. Appl. No. 15/497,142, filed Apr. 25, 2017.

U.S. Appl. No. 62/331,730, filed May 4, 2016.

U.S. Appl. No. 62/326,923, filed Apr. 25, 2016.

* cited by examiner

FIG. 1 shunt 500mA TC #3 500mA

FIG. 2 shunt 500mA TC #3 250mA

FIG. 3 shunt 500mA TC #3 125mA

FIG. 4 shunt 500mA TC #3 62.5mA

METHOD OF CALIBRATING IMPEDANCE MEASUREMENTS OF A BATTERY

This application claims benefit of U.S. Provisional Application No. 62/326,923, filed Apr. 25, 2016, and U.S. Provisional Application No. 62/331,730, filed May 4, 2016, the disclosures of which are hereby incorporated by reference in their entirety including all figures, tables and drawings.

BACKGROUND OF THE INVENTION

Batteries and other electrical energy storage devices have become widely used in not only military, space, and commercial applications but also in domestic applications. Therefore, it has become even more important to be able to efficiently and effectively obtain an accurate estimation of the battery's state-of-health. While voltage, current, and temperature may be used to gauge the remaining capacity of a battery, in critical applications it is also necessary to know impedance and power capability to get an accurate picture of battery health. Ideally, any measurement of battery health is done in-situ and has minimal impact on the battery. A great deal of work has been conducted to test battery impedance without effecting battery status. This work is documented in, for example, U.S. Pat. Nos. 7,688,036; 7,395,163 B1; 7,675,293 B2; 8,150,643 B1; 8,352,204 B2; 8,762,109 B2; 8,868,363 B2; and 9,244,130 B2, and U.S. Published Patent Application Nos. 2011/0270559 A1; 2014/0358462 A1; and 2017/0003354 A1. Each variation of the methods described in these documents improve the process of assessing battery health by, for example, increasing resolution. Recently, a method for testing battery impedance has been described that increases the resolution of a known system by a factor often. Key features of this high resolution method involve a new algorithm, auto-ranging to obtain the optimum level of excitation current, and increased preamplifier gain. The method also required an additional measurement channel that captures time records of the Sum-Of-Sines (SOS) current in addition to the SOS voltage from the test battery.

Although the above-methods have refined this important process, an improved method for calibration that will greatly simplify the calibration process and eliminate the extra measurement channel needed for some methods is still needed.

All patents, patent applications, provisional patent applications and publications referred to or cited herein, are incorporated by reference in their entirety to the extent they are not inconsistent with the teachings of the specification.

SUMMARY OF THE INVENTION

The invention involves an improved method of calibrating impedance measurements of a battery. The method needs only a single measurement with a known Sum of Sines (SOS) current, at the desired frequency spread and known root mean squared (RMS) current.

DETAILED DESCRIPTIONS OF THE INVENTION

Figure 1:
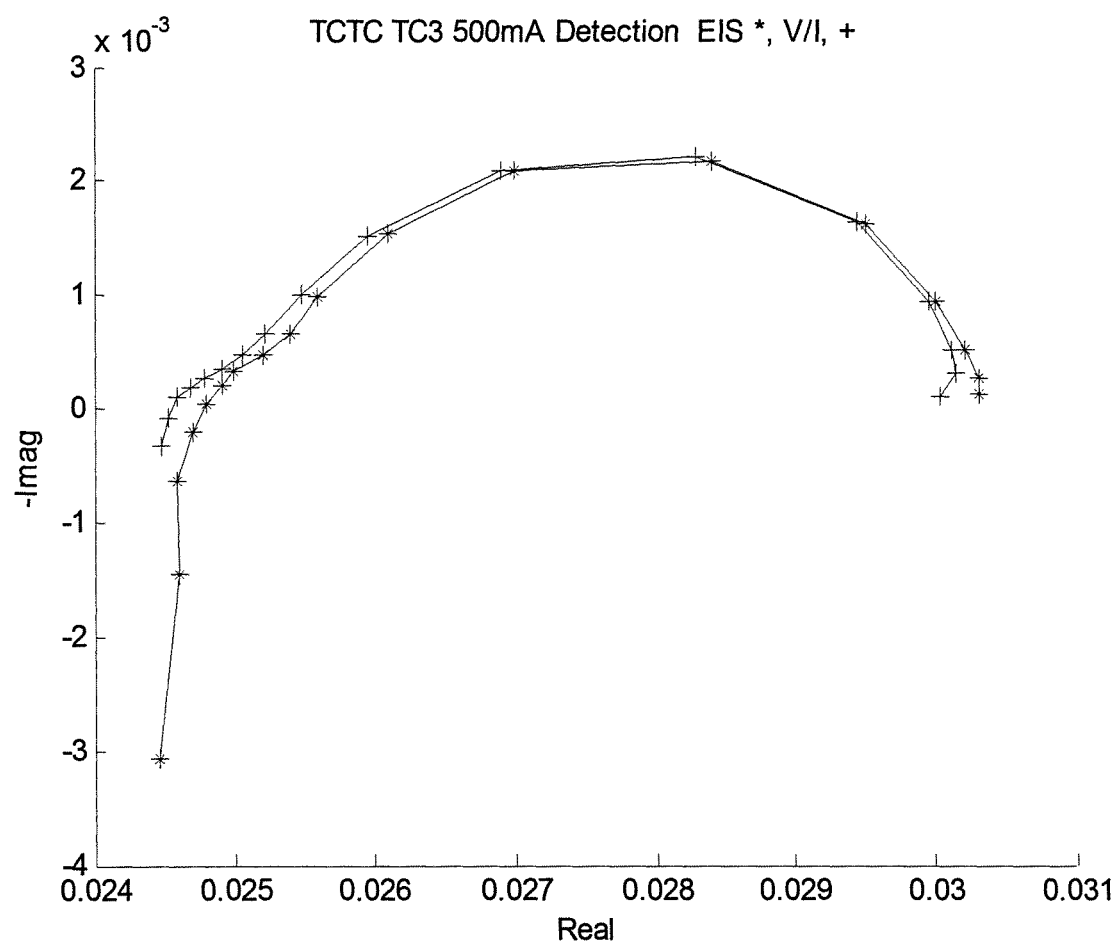
FIG. 1 shows the single shunt calibration of a test cell at 500 mA using the method of the subject invention.
Figure 2:
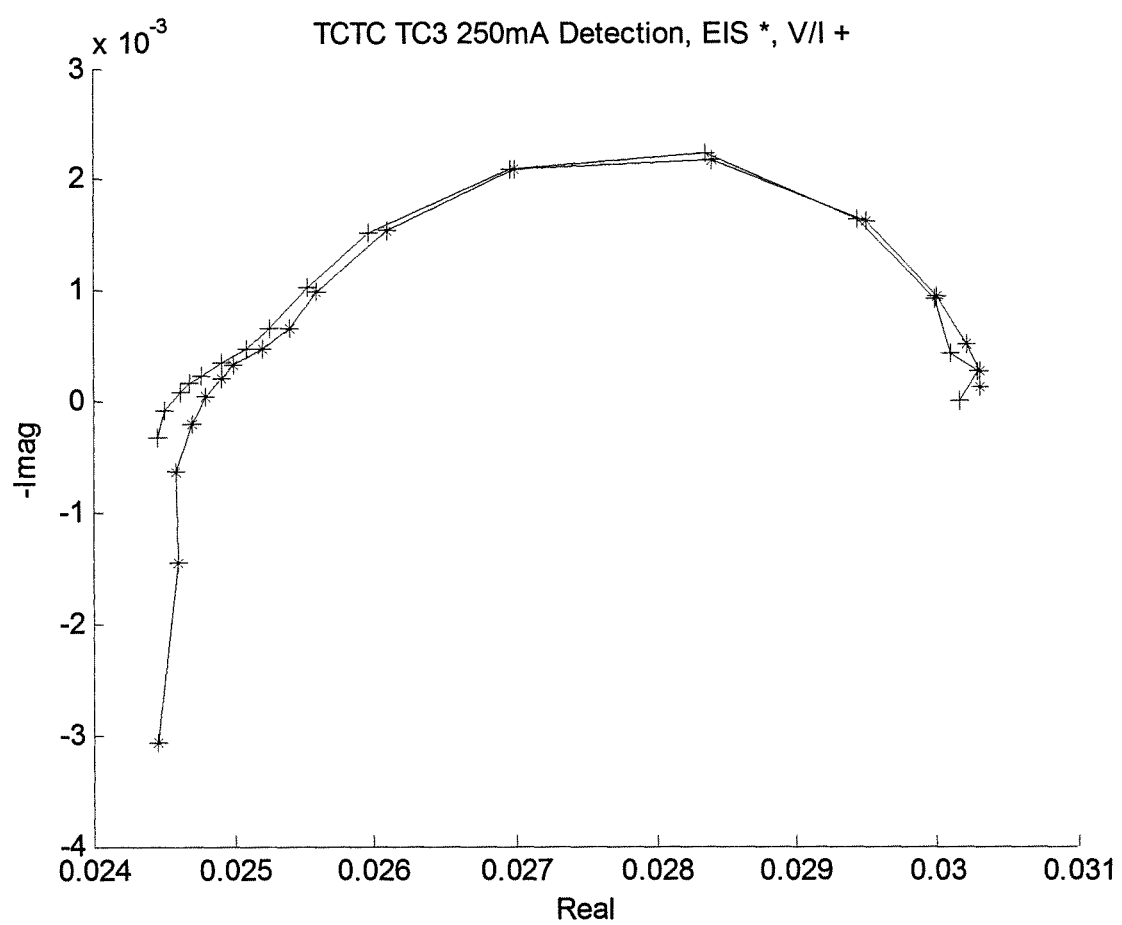
FIG. 2 shows the single shunt calibration of a test cell with RMS current scale 500 mA down to 250 mA using the method of the subject invention.
Figure 3:
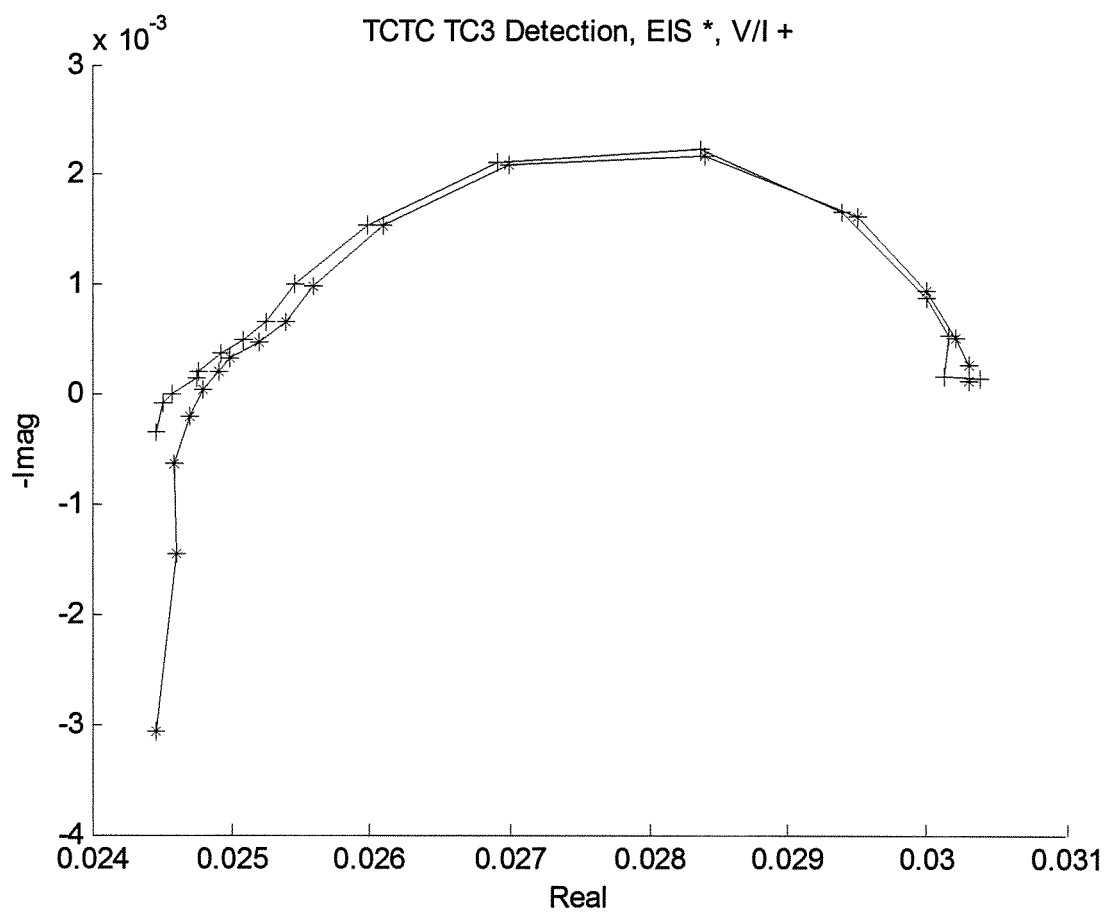
FIG. 3 shows the single shunt calibration of a test cell with RMS current scale 500 mA down to 125 mA using the method of the subject invention.
Figure 4:
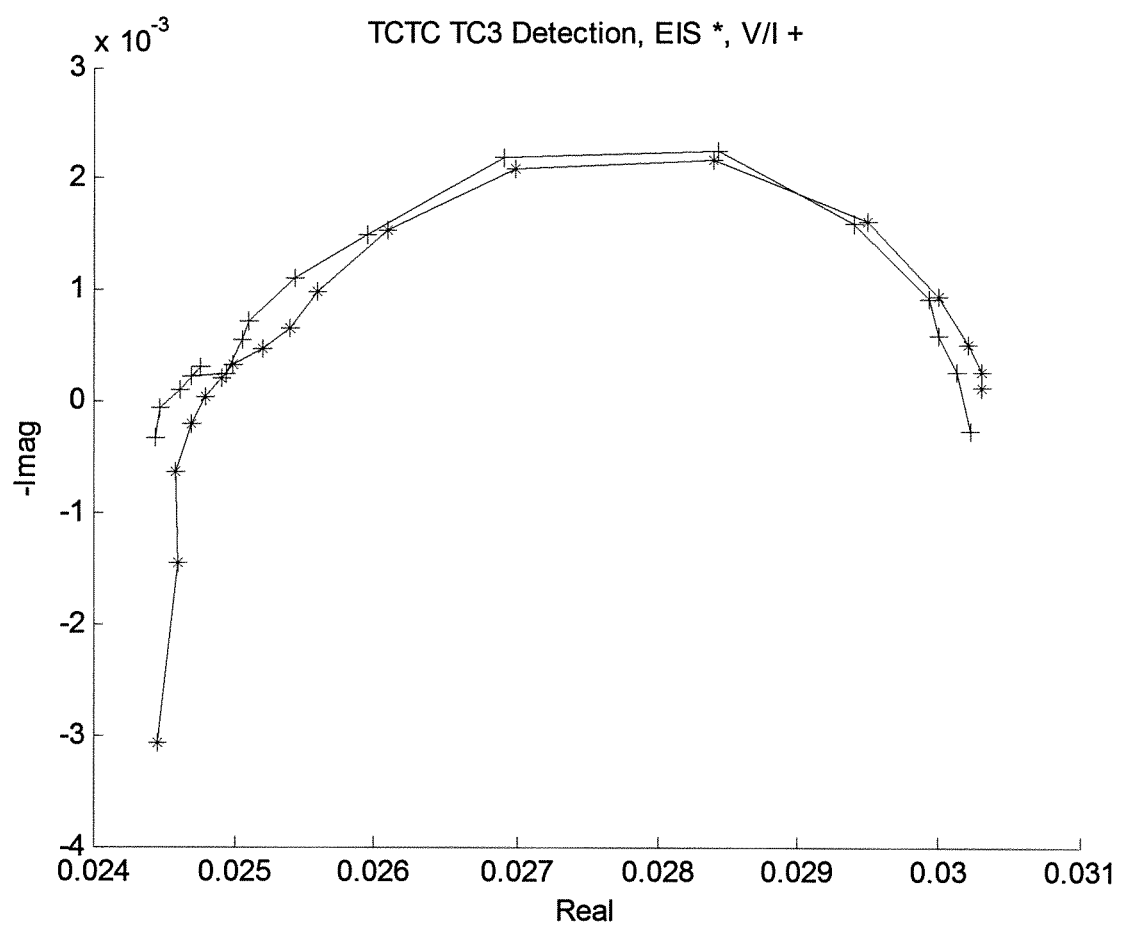
FIG. 4 shows the single shunt calibration of a test cell with RMS current scale 500 mA down to 62.5 mA using the method of the subject invention.

The method of the subject invention is involves single shunt calibration (SSC) that applies to all generations of (Impedance Measurement Box) IMB. The subject method simplifies use of the IMB to assess battery health. The Idaho National Laboratory (INL) has described the design and construction of the IMB in numerous patent documents (see, for example, U.S. Pat. Nos. 7,688,036; 7,395,163 B1; 7,675,293 B2; 8,150,643 B1; 8,352,204 B2; 8,762,109 B2; 8,868,363 B2; and 9,244,130 B2, and U.S. Published Patent Application Nos. 2011/0270559 A1; 2014/0358462 A1; and 2017/0003354 A1). Spectrum algorithms used in the implementation are also described in the above patent documents and include, but are not limited to, harmonic compensated synchronous detection (HCSD), fast summation transformation (FST), generalized fast summation transformation (GFST), frequency cross talk compensation (FCTC), time cross talk compensation (TCTC), harmonic orthogonal synchronous transformation (HOST). Each of these spectrum algorithms are special cases of a rapid Fourier Transform that bring the measurement time record captured by the IMB measurement into the frequency domain at only the frequencies that were part of the IMB excitation signal to the test battery. The calibration in the present generation 50V IMB (U.S. Patent Application Publication No. 2014/0358462) is accomplished by a complicated measurement scheme which uses 3 different shunts to generate calibration constants that yield a very accurate measurement of the impedance spectra from a test battery (Morrison, William. H., thesis, 2012). In contrast, the claimed method requires only a single measurement with a known Sum Of Sines (SOS) current, at the desired frequency spread and known RMS current.

As an example consider application to the 50V IMB (U.S. Patent Application Publication No. 2014/0358462). With the present 50V IMB HCSD algorithm system (U.S. Patent Application Publication No. 2014/0358462), the calibration for a given SOS frequency spread (octave harmonic short 0.1 Hz to 1638.4 Hz or long 0.0125 Hz to 1638.4 Hz) and a given SOS RMS current, the measurement time record that is processed into the frequency domain is typically one period of the lowest frequency. As part of the calibration the SOS current output is pre-emphasized to mitigate the IMB system frequency response. Additionally, the 3 shunt calibration scheme computes gain and offset constants for both magnitude and phase at each frequency. Equation 1 represents the time record captured by the IMB from a measurement on a test battery.

$$V_B(t) = I_{SOS}(t) * A_S(t) * Z_B(t) \quad (1)$$

Where: $I_{SOS}(t)$ is the SOS current time record
$A_S(t)$ is the measurement system impulse response
$Z_B(t)$ is the test battery impedance impulse response
The * in Equation 1 is a convolution operation. Because of the calibration pre-emphasis, $I_{SOS}(t)$ is given by:

$$I_{SOS}(t) = RMS \sqrt{\frac{2}{m}} \sum_{i=1}^{m} \sin(\omega_i t) \quad (2)$$

Where: RMS is the RMS of the SOS current
m is the number of frequencies in the SOS
$\omega_i$ is the $i^{th}$ radian frequency
Note that the RMS of a SOS signal is:

$$RMS = \sqrt{\sum_{i=1}^{m} \left(\frac{1}{T_i} \int_{T_i} (V_P \sin(\omega_i t))^2 dt\right)} = V_P \sqrt{\frac{m}{2}}$$

$$V_P = RMS \sqrt{\frac{2}{m}}$$

Equations 1 and 2 brought into the frequency domain via the 50V IMB HCSD algorithm (Morrison, William H., thesis, 2012) becomes:

$$\vec{V}_{Bi} = RMS \sqrt{\frac{2}{m}} (A_{Si} \Box \phi_{Si})(Z_{Bi} \Box \phi_{Bi}) \quad (3)$$

Where: $A_{Si} \Box \phi_{Si}$ the measurement system frequency response at the $i^{th}$ frequency
$Z_{Bi} \Box \phi_{Bi}$ is the desired battery impedance at the $i^{th}$ frequency
The effect of calibration is to multiply Equation 3 by a calibration constant given by:

$$CAL_i = \left(RMS \sqrt{\frac{2}{m}} (A_{Si} \Box \phi_{Si})\right)^{-1} \quad (4)$$

Clearly the calibration applied to Equation 3 results in the desired battery impedance and the 50V IMB has demonstrated this with great success via the 3 shunt magnitude calibration and the stepped phase shift calibration both yielding gain offset calibration constants that represent Equation 4 (Morrison, William H. thesis, 2012). Observe that Equation 4 is a calibration constant that is a combination of SOS current pre-emphasis and magnitude phase calibration at each frequency. The subject method does everything in a single measurement with a single shunt, single shunt calibration (SSC).

Figure 13:
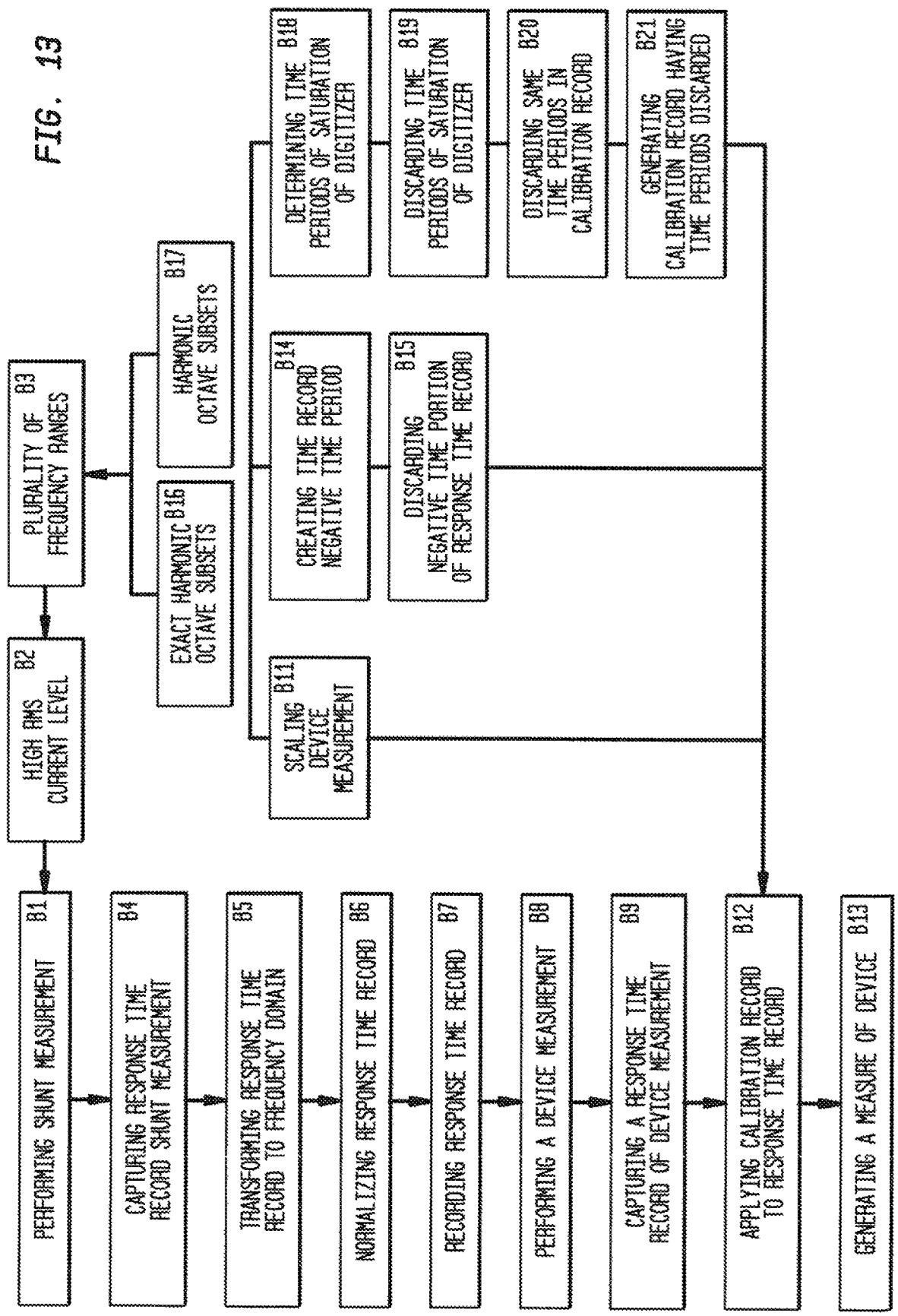
FIG. 13 is a block flow diagram of a method for generating a measure of impedance of a test device.

For the 50V IMB system the concept is very simple. The system will perform a spectrum measurement on a known non-inductive shunt for example a 50 mOhm non-inductive calibration shunt (as shown in FIG. 13, Block B1). The SOS current is set to the high level, 500 mA RMS (as shown in FIG. 13, Block B2). The system must be configured for no pre-emphasis and no calibration (U.S. Patent Application Publication No. 2014/0358462). As the 50V IMB uses the HCSD algorithm, either 18 frequencies are selected, 0.0125 Hz to 1638.4 Hz or 15 frequencies 0.1 Hz to 1638.4 Hz both in octave steps (as shown in FIG. 13, Block B3). The measurement is performed and processed via the HCSD algorithm to convert the captured time record into the frequency domain (as shown in FIG. 13, Blocks B4 and B5 respectively). Then the complex results at each frequency are normalized to the measurement shunt value and the SOS RMS current (as shown in FIG. 13, Block B6). These results are in fact Equation 6 and are stored in a calibration file that when recalled can be used to calibrate a battery impedance measurement with the same frequency spread and different RMS current (as per Equation 9)(as shown in FIG. 13, Block B7).

For the single shunt calibration (SSC), we assume that single shunt used is constant and independent of frequency over the frequency range of the IMB. Additionally, all measurements are made without any pre-emphasis. Thus as a function of time the IMB measurement of that shunt $V_{SHUNT}(RMS,i\Delta t)$ is given by Equation 5.

$$V_{SHUNT}(RMS,i\Delta t) = V_{SOS}(RMS,i\Delta t) * H_{OUT}(t) * R_{SHUNT} * H_{IN}(i\Delta t) \quad (5)$$

Where *: indicates the convolution operation
$V_{SOS}(RMS,i\Delta t)$: is the computer generated signal to IMB current drivers
$H_{OUT}(t)$: is the current driver system response in time
$i\Delta t$: is the computer discrete time
$R_{SHUNT}$: is the calibration shunt, ohms
$H_{IN}(i\Delta t)$: is the IMB system input response in discrete time
Also as a function of time the IMB measurement of a test battery is given by Equation 6.

$$V_{Meas}(RMS,i\Delta t) = V_{SOS}(RMS,i\Delta t) * H_{OUT}(t) * Z_{BAT}(t) * H_{IN}(i\Delta t) \quad (6)$$

Where: $Z_{BAT}(t)$ is the impedance impulse response of the battery as a function of time.

For the SSC the time record of the shunt (Equation 5) is processed by the HCSD algorithm of the IMB, normalized by $R_{SHUNT}$ and stored as calibration. Equation 7 illustrated the shunt time record brought into the frequency domain at one of the SOS frequencies $\omega_i$.

$$V_{SHUNT}(\omega_i) = V_{SOS}(\text{RMS}, \omega_i) H_{OUT}(\omega_i) R_{SHUNT} H_{IN}(\omega_i) \quad (7)$$

Where: $\omega_i$ is radians/sec

Note that the convolution operation in Equation 5 goes to multiplication in Equation 7. The time record of the battery given by Equation 6 when brought into the frequency domain at one of the SOS frequencies $\omega_i$ is given by Equation 8.

$$V_{Meas}(\omega_i) = V_{SOS}(\text{RMS}, \omega_i) H_{OUT}(\omega_i) Z_{BAT}(\omega_i) H_{IN}(\omega_i) \quad (8)$$

Performing division in the frequency domain the essence of calibration is given by Equation 9.

$$Z_{BAT}(\omega_i) = R_{SHUNT} \frac{V_{SOS}(\text{RMS}, \omega_i) H_{OUT}(\omega_i) Z_{BAT}(\omega_i) H_{in}(\omega_i)}{V_{SOS}(\text{RMS}, \omega_i) H_{OUT}(\omega_i) R_{SHUNT} H_{in}(i\Delta t)} \quad (9)$$

Thus the SSC is a collection of measurements of $R_{SHUNT}$ at standardized RMS currents and SOS frequency spreads brought into the frequency domain by the HCSD algorithm. For the IMB there are 2 standardized frequency ranges and 4 standardized RMS currents. To calibrate for this, results in 8 measurements with the single shunt for SSC which are performed fully automated with a single shunt hook-up. A vast improvement over the original manual 3 shunt calibration process.

Observe Equation 7, if in addition to being normalized to the shunt if it were normalized also to the calibration RMS current it can be used as a calibration for any battery measurement RMS current by scaling it to that measurement RMS current.

Example 1—Validation Using 50V IMB and RMS Current Scaling

Figure 5:
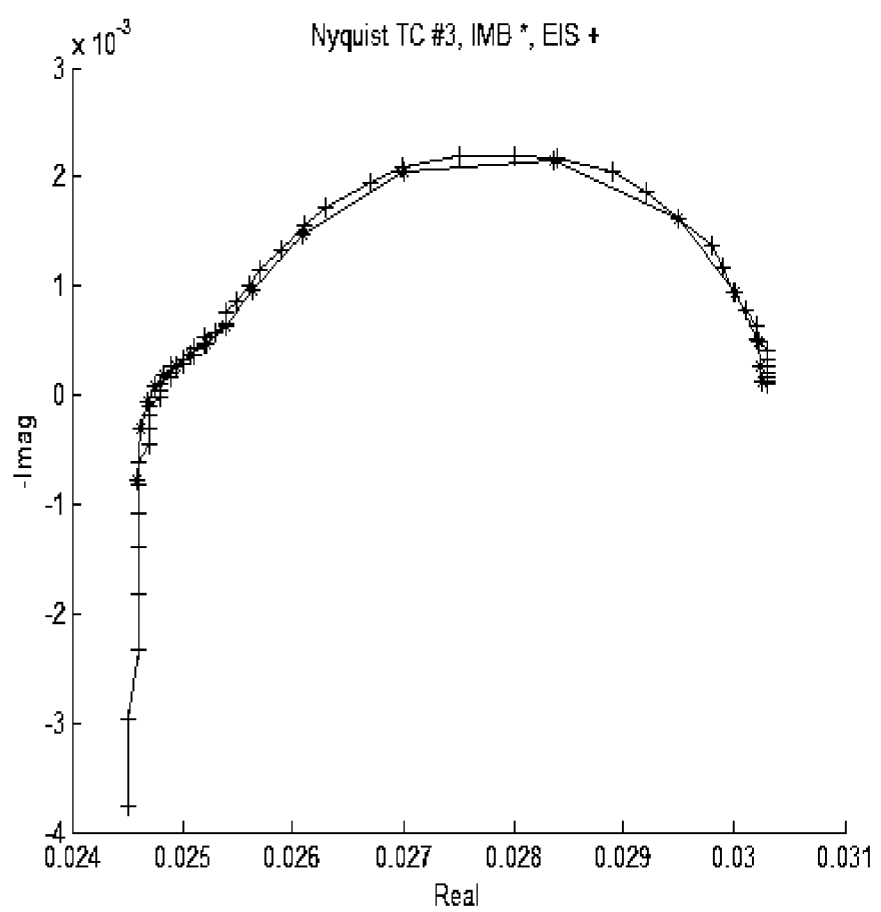
FIG. 5 shows a single shunt calibration with Solatron EIS of a test cell using the method of the subject invention.
Figure 6:
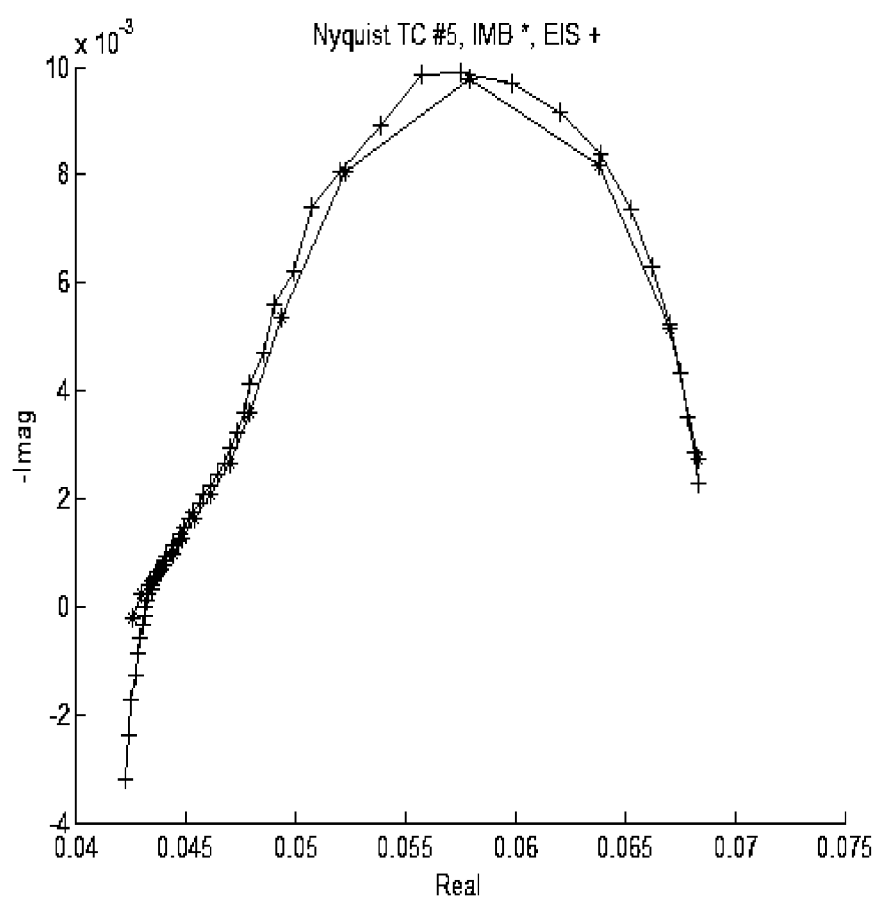
FIG. 6 shows a single shunt calibration with Solatron EIS of a test cell using the method of the subject invention.
Figure 7:
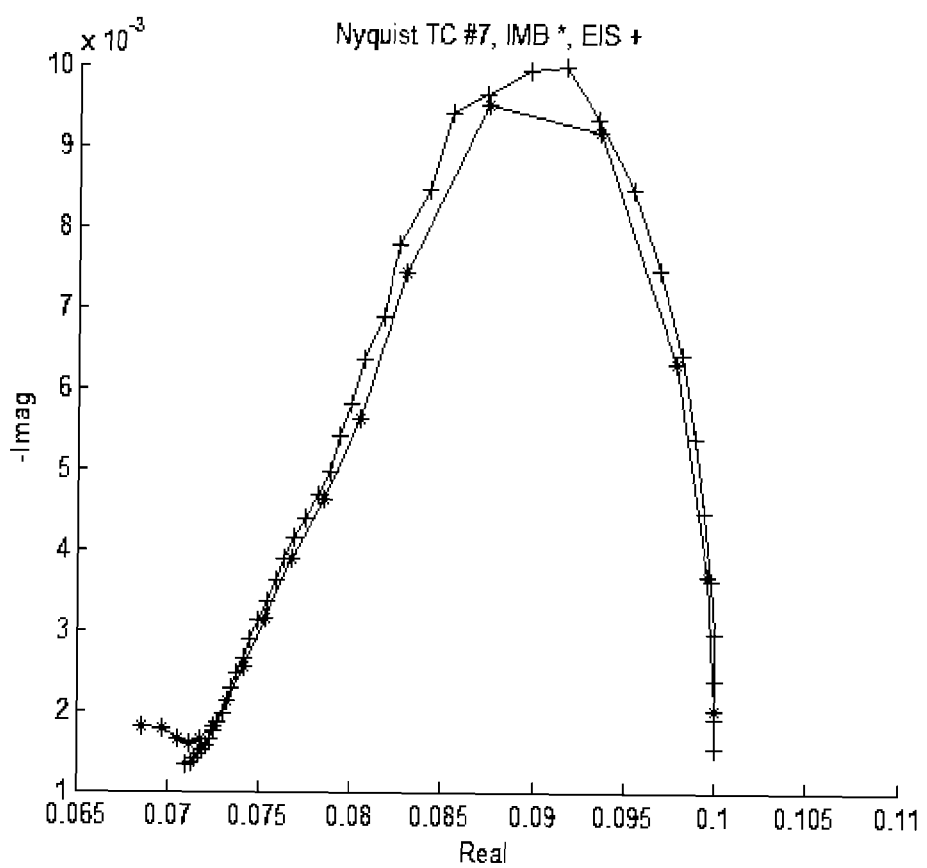
FIG. 7 shows a single shunt calibration with Solatron EIS of a test cell using the method of the subject invention).

The 50V IMB at Montana Tech of the University of Montana (Butte, Mont.) was used for initial testing. A long run frequency (0.0125 Hz to 1638.4 Hz) domain calibration file was generated (via HCSD) with-out any calibration or pre-emphasis at an SOS current of 500 mA and a 50 mOhm shunt (as shown in FIG. 13, Blocks B1-B7). It was normalized to the 50 mOhm shunt and the RMS current. Time records of measurements (long runs, 0.0125 Hz to 1638.4 Hz) were made and captured for Test Cell (TC) #3 (Morrison, William H., thesis, 2012) at RMS currents of 500 mA, 250 mA, 125 mA and 62.5 mA again without any pre-emphasis (as shown in FIG. 13, Blocks B8 and B9). All those Test Cell time records were post processed into the frequency domain with the HCSD algorithm ((as shown in FIG. 13, Block B10). The frequency domain calibration was scaled to each measurement current RMS ((as shown in FIG. 13, Block B11). Test cell measurements were made at all the different currents (of 62.5 mA, 125 mA, 250 mA and 500 mA) and calibrated per Equation 9. The results are shown in FIGS. 1-4. The detected TC #3 spectra are plotted with Electro-chemical impedance spectroscopy (EIS) (Solartron Analytical, 2012) data by INL on TC #3. The validity of the subject method is realized by the degree of coincidence of the two plots. Like results were achieved when the subject method was applied to Test Cells #3, #5, and #7. Results demonstrating SSC with these test cells are plotted and shown in FIGS. 5-7.

These results show that 500 mA shunt data can reach all the way down the 62.5 mA to capture the spectra of TC #3 and the results match closely with INL EIS (Solartron Analytical, 2012) data for TC #3 (as shown in FIG. 13, Block B12). This means that for calibration all that is needed is frequency domain files of known shunt, known frequencies and that file will work on measurements with the same frequencies and different known current with good results. This is a significant enhancement to the existing 50V IMB.

As stated previously, with the single shunt calibration, with standard RMS currents and standard frequency ranges, a calibration is fully automated with as few as 8 measurements. Never the less, that can be reduced to a single calibration measurement with frequency scaling and RMS current scaling. In examining Equation 5 for calibration it would be normalized to the calibration RMS current and the shunt value. Then for a calibration it would be scaled by the measurement RMS. Consider the RMS of an SOS:

$$\text{RMS(SOS)} = \sqrt{\left(\sum_m \frac{V_P^2}{2}\right)} = V_P \sqrt{\frac{M}{2}} \quad (10)$$

Where: M is the number of frequencies $V_P$ is the peak voltage of the sine waves in the SOS Thus given that a measurement frequency range is an octave harmonic subset of a calibration frequency range the frequency domain the subset of real and imaginary constants are selected out and scaled per:

$$(\text{Calibration}) \times \sqrt{\frac{M_{CAL}}{M_{MEAS}}} \times \frac{\text{RMS}_{MEAS}}{\text{RMS}_{CAL}} \quad (11)$$

Example 2—Validation Test of Frequency and RMS Calibration Scaling

Figure 8:
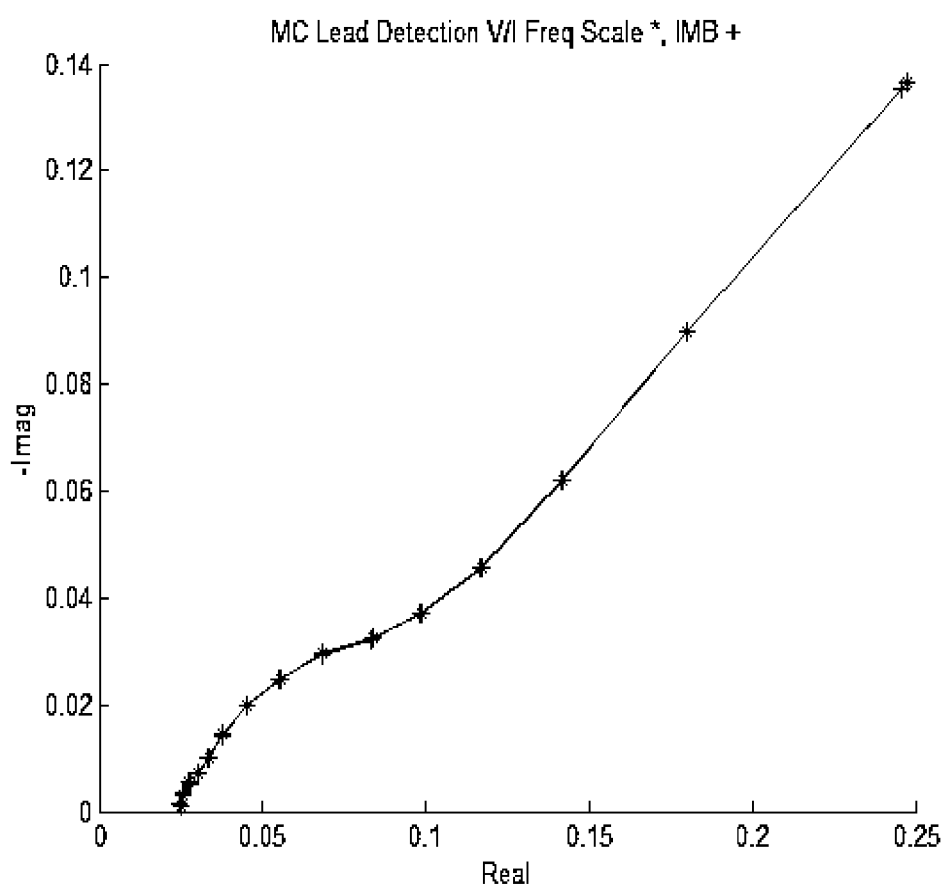
FIG. 8 shows a lead acid battery measured at 62.5 mA and 15 frequency SOS showing 18 to 15 frequency and 500 mA to 62.5 mA RMS current and frequency scaling.
Figure 9:
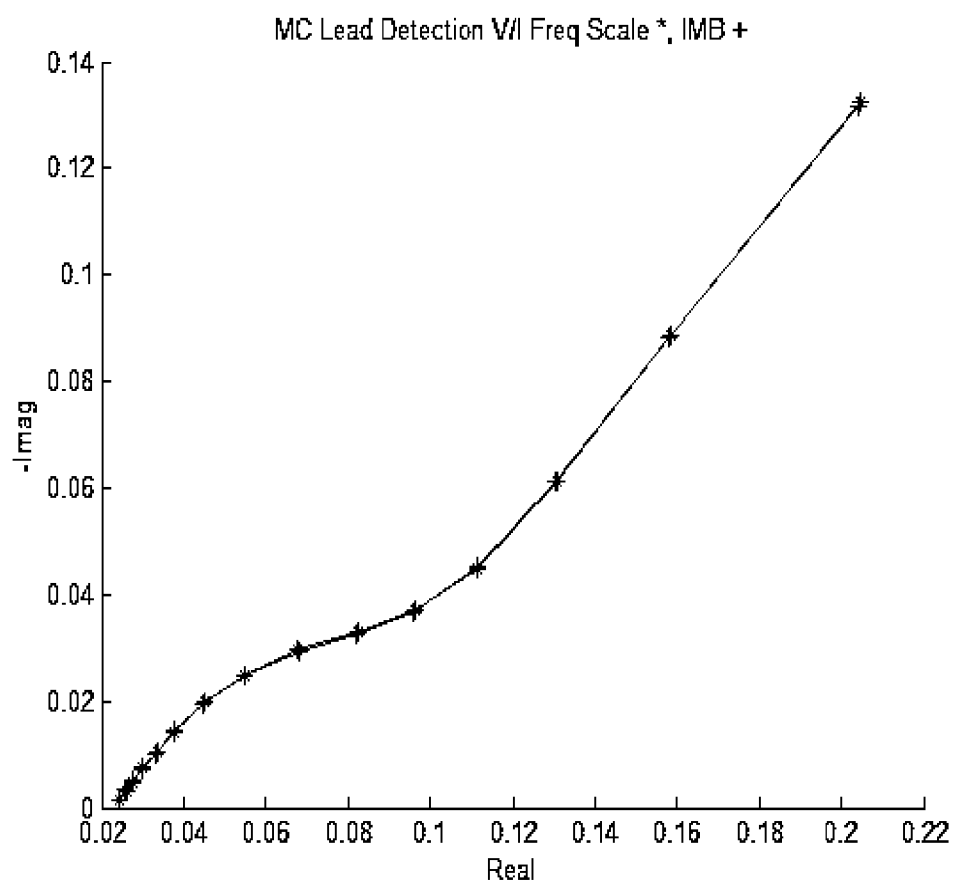
FIG. 9 shows a lead acid battery measured at 125 mA RMS SOS showing 18 to 15 frequency and 500 mA to 125 mA RMS current scaling and frequency scaling.

Small lead acid battery measured by IMB with 62.5 mA and 15 frequency SOS. IMB spectrum obtained with normal IMB calibration. Uncalibrated time record post processed to the frequency domain and calibrated by an 18 frequency 500 mA shunt time record brought to the frequency domain and scaled to 15 frequency and 62.5 mA RMS. Both spectra are given in FIG. 8. FIG. 9 shows the battery measured by IMB at 125 mA RMS SOS (as shown in FIG. 13, Block B13). These results support frequency and RMS current scaling for SSC.

Example 3—Negative Time to Reinforce the Assumption of Steady State

The fundamental assumption of all IMB data processing algorithms is that the system being measured is in steady state relative to all excitation frequencies. Clearly this is in contradiction to the requirement of performing a rapid measurement. The IMB measurement technique is to excite the test article with a sum of sinusoids with an excitation time record of no more than one period of the lowest frequency. Some researchers using the IMB measurement concept (Waligo, A., 2016) have resorted to using multiple periods of the lowest frequency in order to re-inforce this assumption. A better solution is "Negative Time" (NT), whereby the sum of sinusoids starting at time zero would all be zero but if one goes backwards in time for a fraction of the period of the lowest frequency, then start the excitation there, this has been shown to work very well to establish the steady state approximation (10% is typical) (as shown in FIG. 13, Block B14). This NT portion is either ignored or discarded from the captured voltage response (as shown in FIG. 13, Block B15). Additionally, NT is also needed for shunt calibration as smoothing filter in the IMB will need to be brought to steady state.

Figure 10:
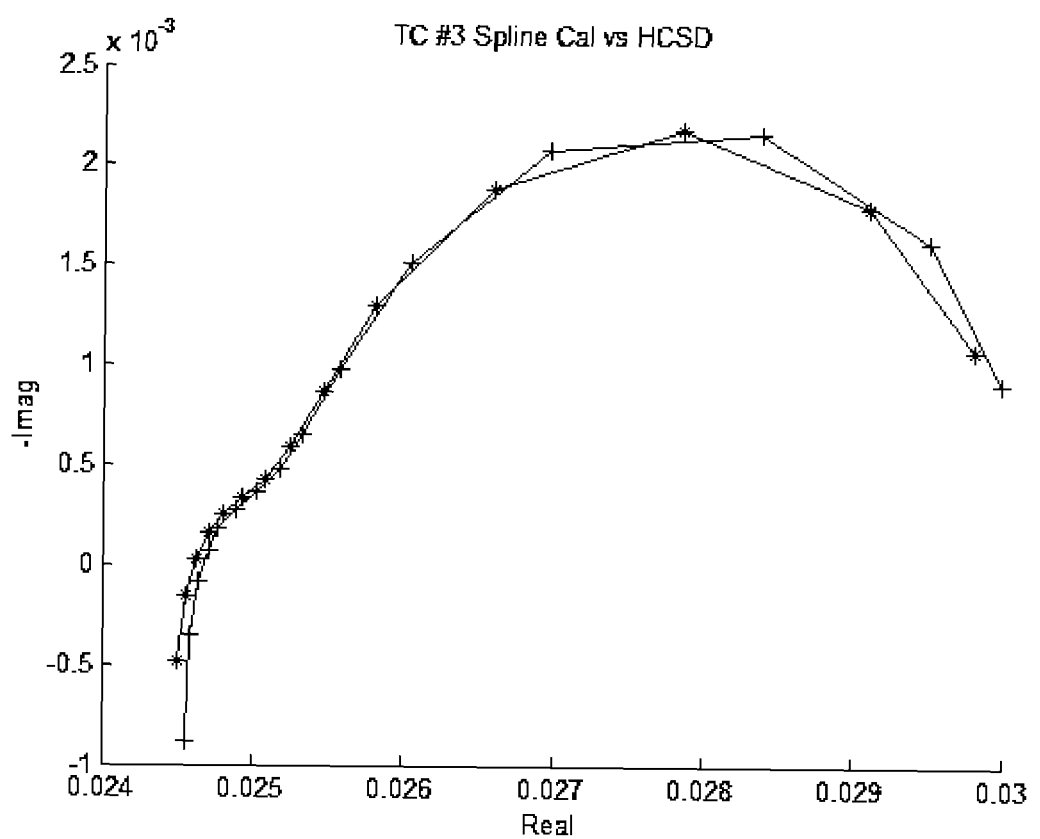
FIG. 10 shows splining the calibration 14 frequencies in octaves downward from 1000 Hz calibrated with 15 frequencies in octaves from 0.1 Hz to 1638.4 Hz.
Figure 11A:
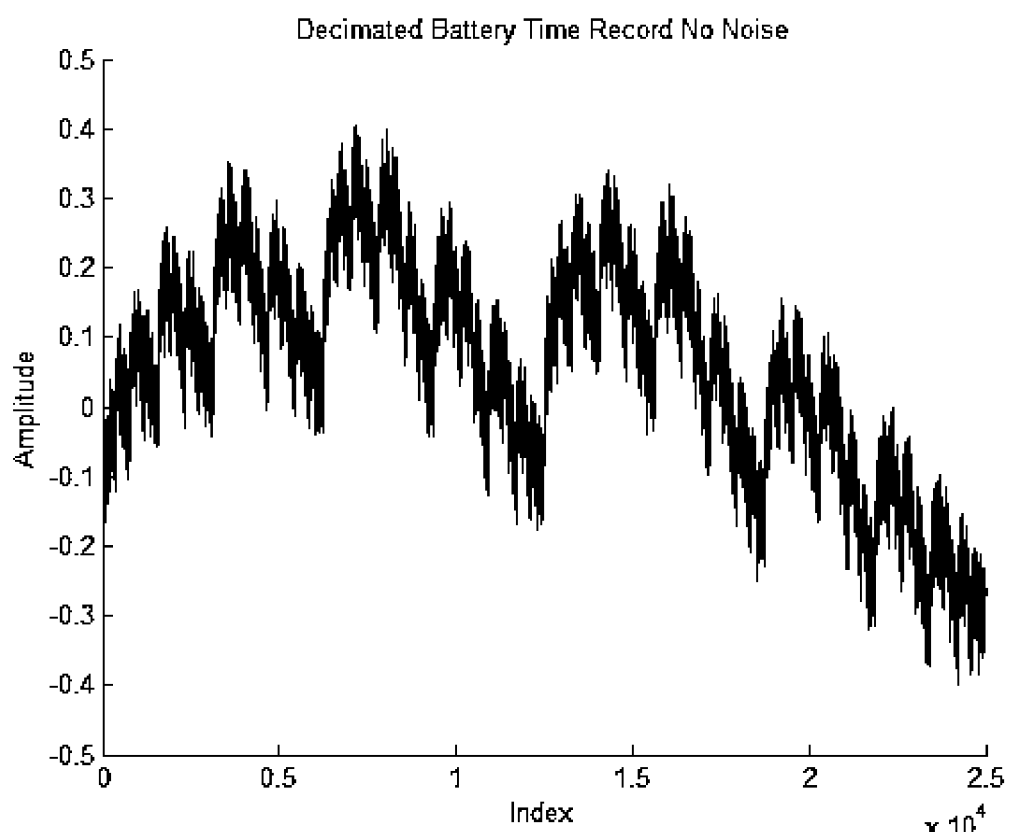
FIG. 11A demonstrates saturation tolerance time CTC algorithm with a 12 V lead acid car battery and shows the unclipped battery time record.
Figure 11B:
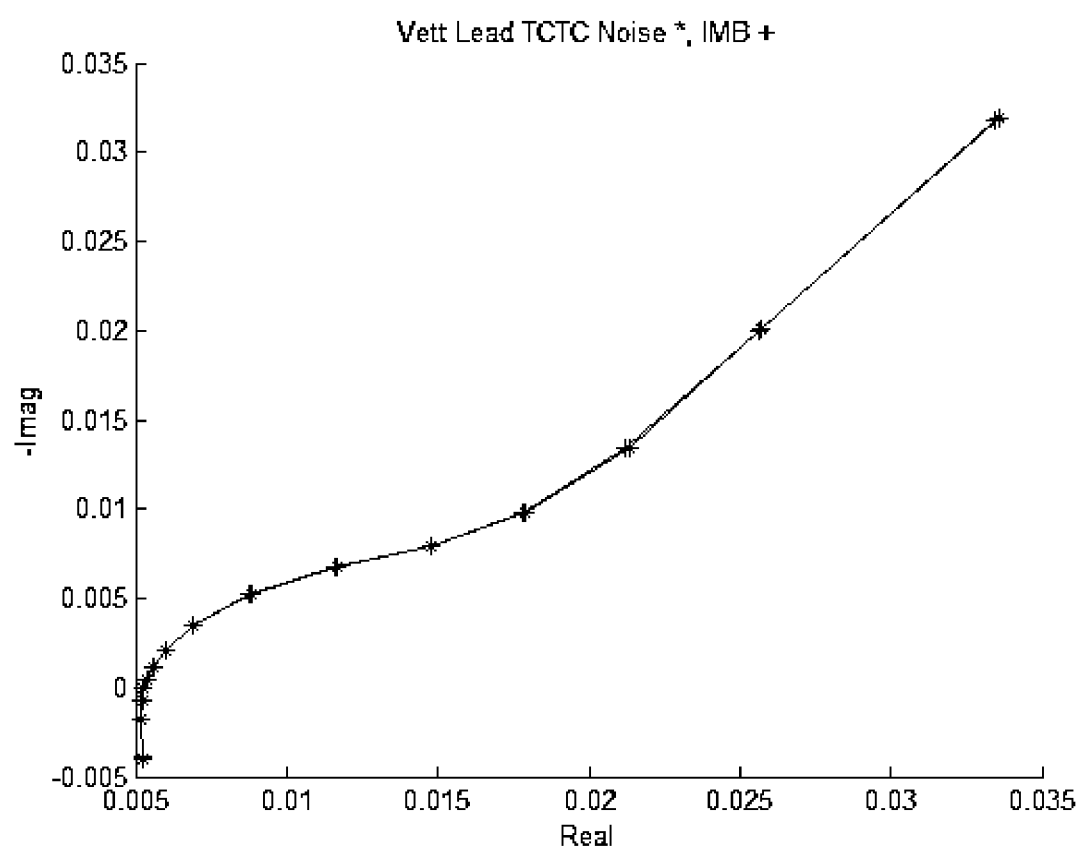
FIG. 11B demonstrates saturation tolerance time CTC algorithm with a 12 V lead acid car battery and shows the unclipped TCTC with baseline HCSD spectrum.
Figure 11C:
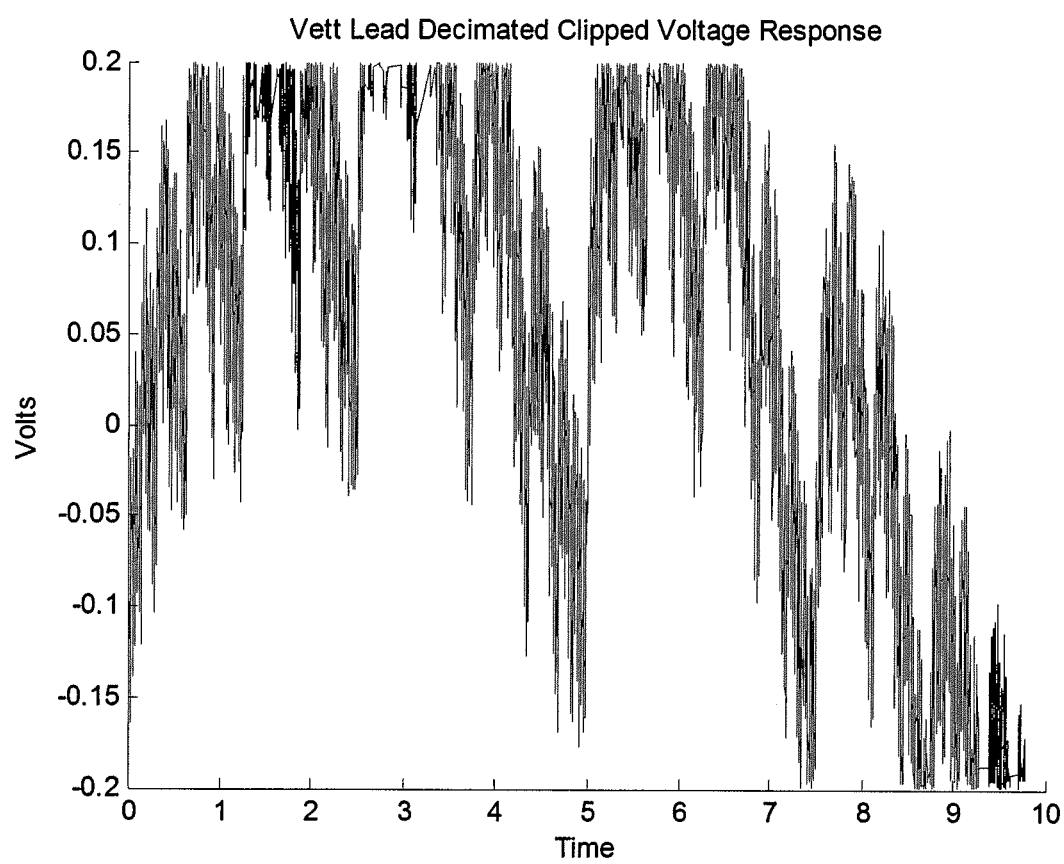
FIG. 11C demonstrates saturation tolerance time CTC algorithm with a 12 V lead acid car battery and shows the clipped battery time record.
Figure 11D:
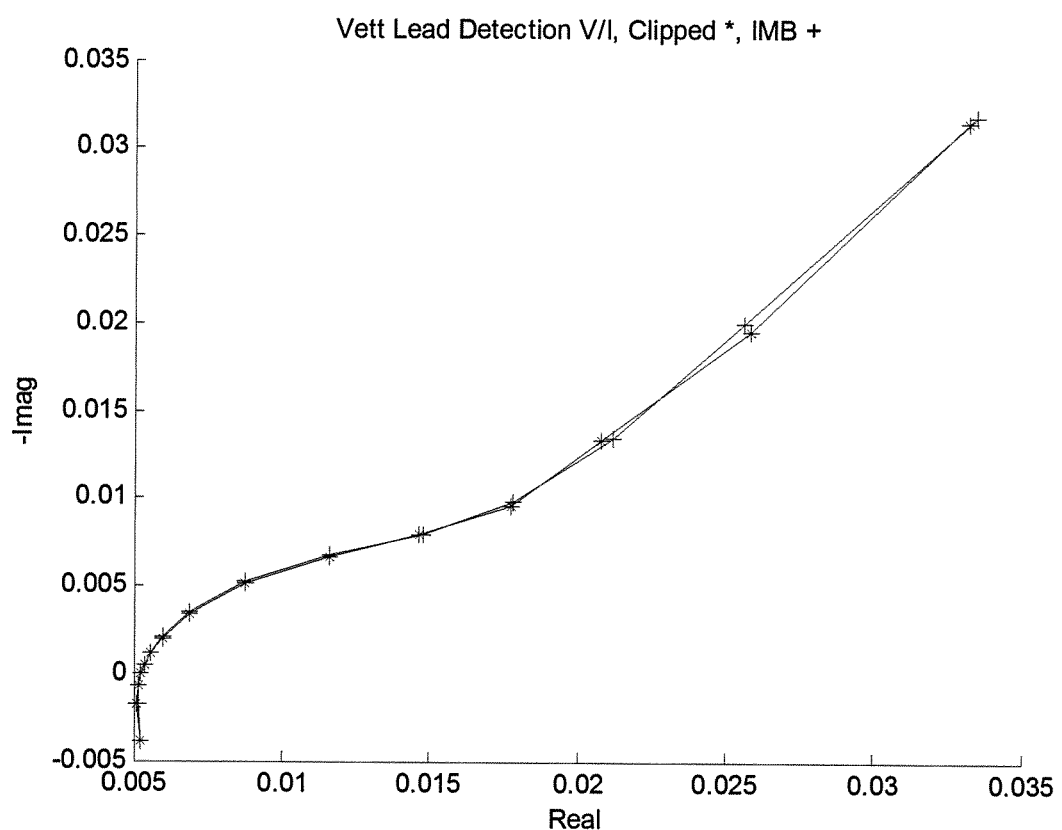
FIG. 11D demonstrates saturation tolerance time CTC algorithm with a 12 V lead acid car battery and shows the clipped spectrum with baseline HCSD spectrum.
Figure 12A:
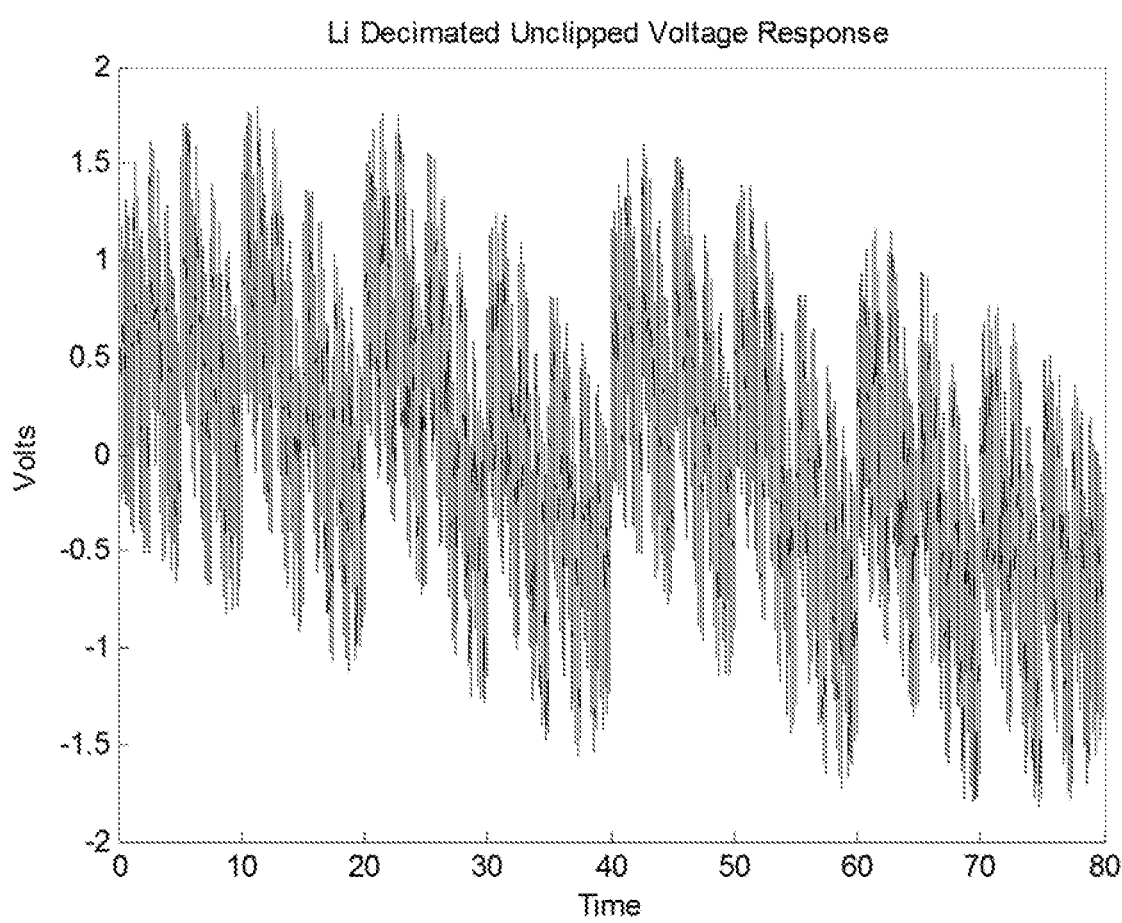
FIG. 12A demonstrates saturation tolerance TCTC algorithm with a Lithium ion battery and shows the unclipped battery time record.
Figure 12B:
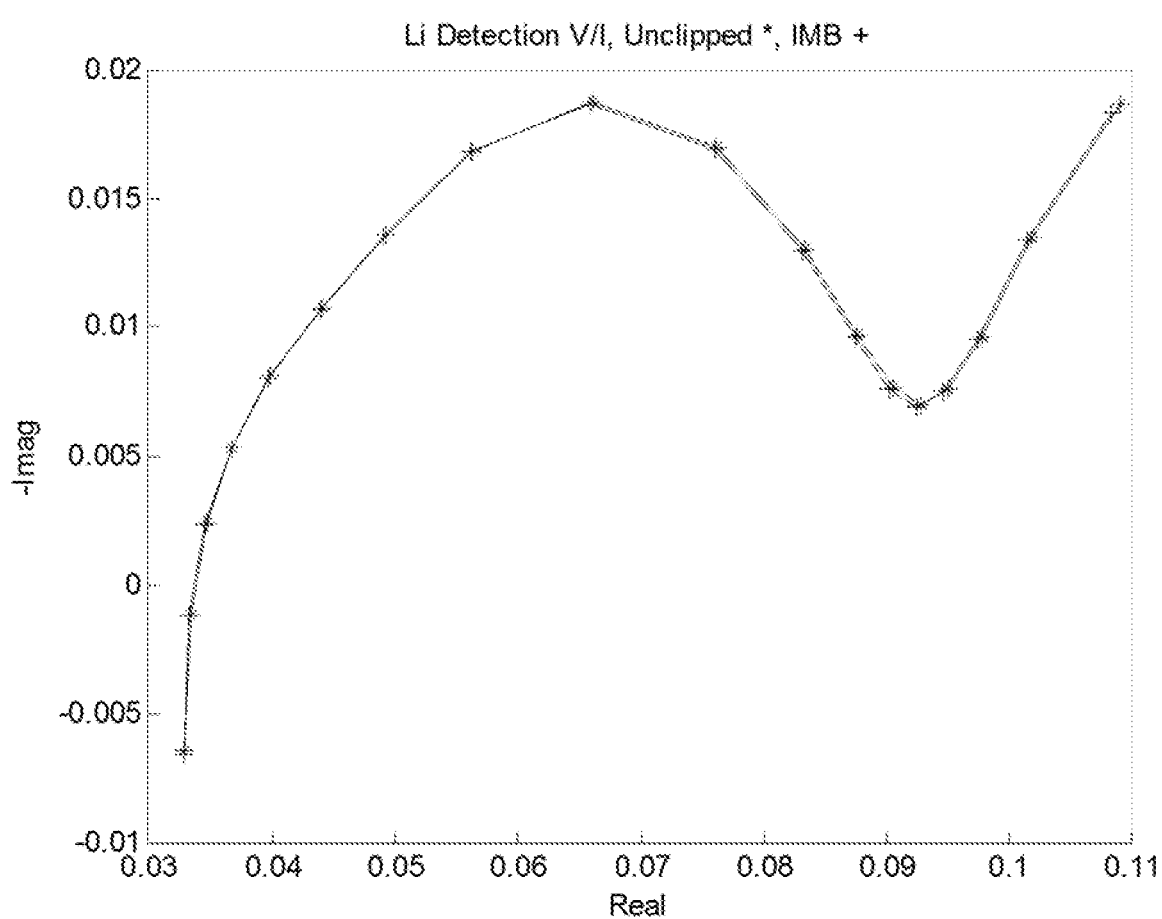
FIG. 12B demonstrates saturation tolerance TCTC algorithm with a Lithium ion battery and shows the unclipped TCTC with baseline HCSD spectrum.
Figure 12C:
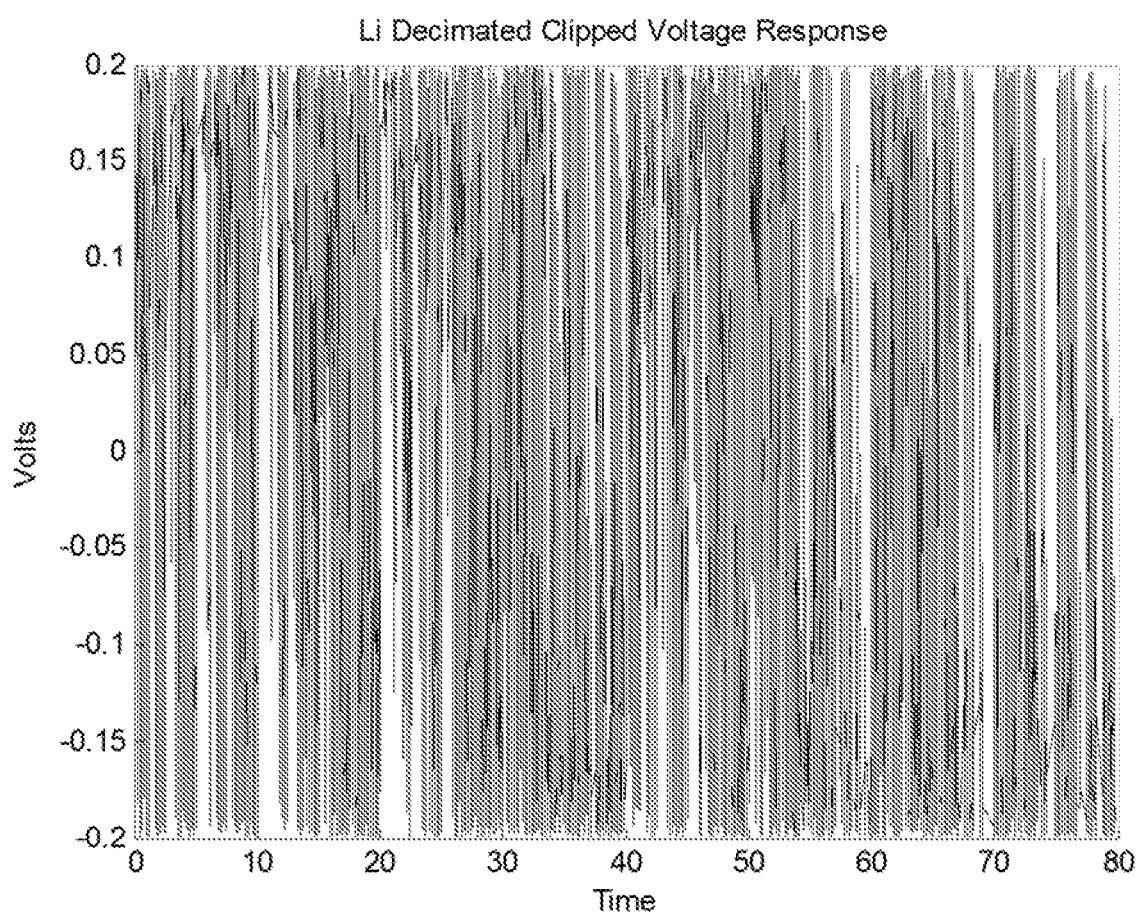
FIG. 12C demonstrates saturation tolerance TCTC algorithm with a Lithium ion battery and shows the clipped battery time record.
Figure 12D:
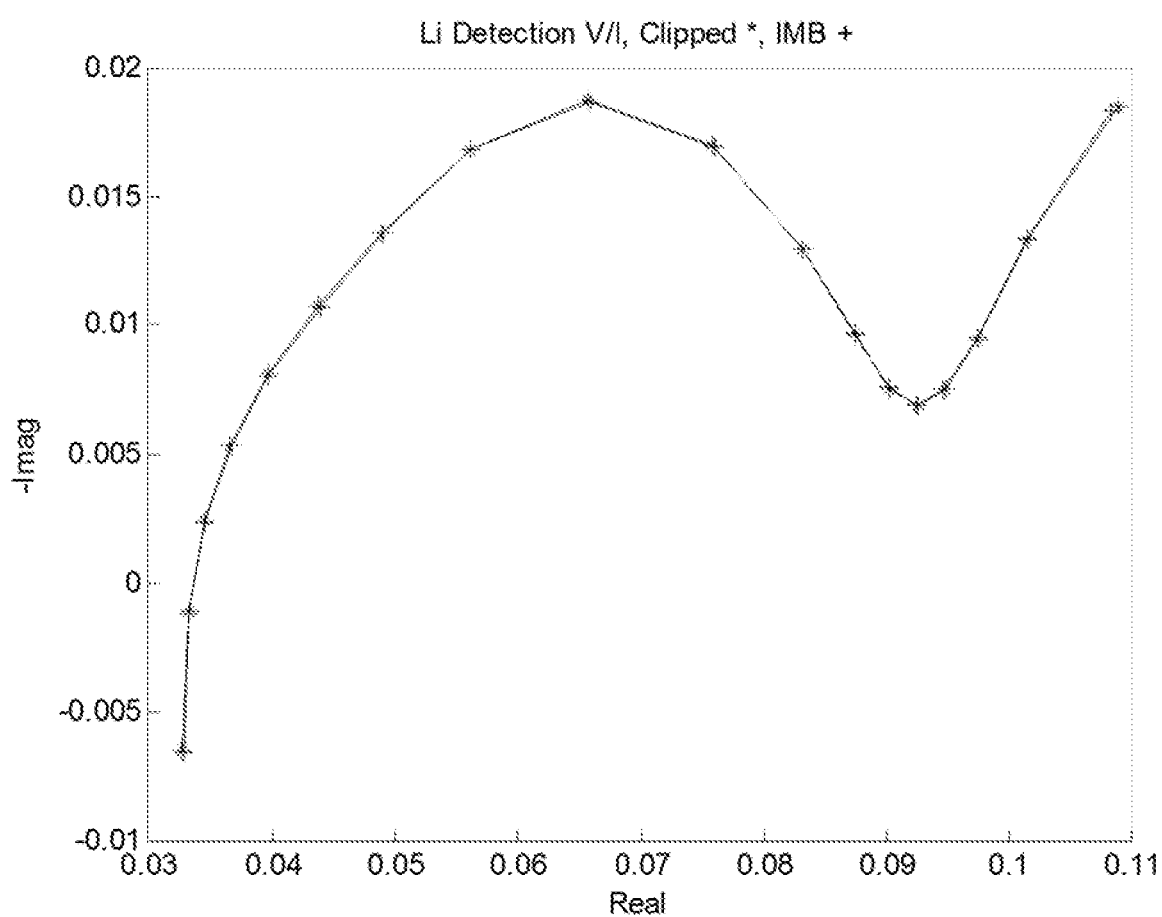
FIG. 12D demonstrates saturation tolerance TCTC algorithm with a Lithium ion battery and shows the clipped spectrum with baseline HCSD spectrum.

When a calibration is scaled the objective is to make $V_P$ of a measurement and calibration the same thus the frequency range could be kept standardized as subsets of the calibration frequency range. Never the less, for non-standard subsets, even non-octave harmonic subsets processed via time or frequency CTC (U.S. Pat. No. 8,762,109) the technique of "cubic spline" (U.S. Pat. No. 8,868,363) will select out the calibration constants and they will scale exactly as the above relationship (as shown in FIG. 13, Block B16). FIG. 10 shows splining the calibration of 14 frequencies in octaves downward from 1000 Hz calibrated with 15 frequencies in octaves from 0.1 Hz to 1638.4 Hz (as shown in FIG. 13, Block B17).

Example 4—Application to Saturation Tolerant Time and Frequency CTC

A critical feature of the concept for a High Resolution Impedance Measurement Box (HRIMB) is its ability to digitize signals where the voltage level of the signal is near and occasionally beyond the saturation level of the digitizer within the Data Acquisition system (DAQ). This capability of the HRIMB is realized by replacing the data processing algorithm (HCSD Morrison, W. H., thesis, 2012)) with a variation of time or frequency CTC (U.S. Pat. No. 8,762,109) (TCTC, FCTC). This feature for these 2 algorithms is achieved by examining the captured voltage time record for saturation points (as shown in FIG. 13, Block B18), noting the exact times of saturation, deleting those points from the voltage time record (as shown in FIG. 13, Block B19), and computing the algorithm correction matrices at only the times for non-saturation. This technique works for both TCTC and FCTC. These algorithms will bring the time domain voltage measurements (with occasional saturation) into the frequency domain but they must be calibrated to become impedance. This is achieved by retrieving an archived time record of a single shunt measurement that has the exact frequencies of the "to be calibrated voltage" measurement, has been normalized to the measurement shunt and its RMS current. That time record is scaled to the RMS current of the "to be calibrated voltage" and the exact points of the saturation in "to be calibrated voltage" time record are deleted from this time record (as shown in FIG. 13, Block B20). It is then processed with the same correction matrices used with the "to be calibrated voltage" time record (as shown in FIG. 13, Block B21). The impedance at each frequency is the ratio of the "to be calibrated voltage" phasor to the calibration phasor. Note that if decimation was used on the time records in the application of TCTC or FCTC the same decimation must be applied to the calibration time record. Decimation is a technique of uniformly discarding data points from time records to speed up data processing for TCTC or FCTC. Depending on the type of battery being tested it should be kept below X16 and should be applied prior to deletion of saturated data points.

Demonstration of saturation tolerance Time CTC algorithm with a 12V lead acid car battery, 500 mA RMS SOS current, 15 frequencies (0.1 Hz to 1638.4 Hz) plotted with the IMB HCSD measurement response is shown in FIG. 11. Simulated clipping was done by discarding all points in the time record of the response above or below 0.17V. The algorithm was calibrated by a time record of 15 frequencies and 500 mA RMS applied to a shunt. FIG. 11A is the battery voltage time record. FIG. 11B is the spectrum plotted without clipping plotted with the IMB HCSD spectrum. FIG. 11C shows the clipped at +/−0.17V battery voltage time record. FIG. 11D shows the Time CTC clipped spectrum plotted with the baseline HCSD spectrum.

FIG. 12 shows a similar demonstration of time CTC clipping Li Ion battery. An 18 frequency (0.0125 Hz to 1638.4 Hz) 500 mA RMS SOS measurement was made on an Li Ion battery and a 50.27 mOhm shunt. Clipping tolerance was demonstrated by the battery voltage response at +/−0.2V. The Time CTC results are plotted with the baseline HCSD IMB spectrum. FIG. 12A gives the unclipped battery voltage time record. FIG. 12B gives the time CTC processing of FIG. 12A calibrated with the shunt time record plotted with the HCSD baseline spectrum. FIG. 12C gives the +/−0.2V clipped battery voltage time record plotted with the clipping adjusted shunt time record. FIG. 12D gives the time CTC clipped spectrum plotted with the baseline HCSD spectrum. All time CTC processing was done with a X16 decimation.

It is understood that the foregoing examples are merely illustrative of the present invention. Certain modifications of the articles and/or methods may be made and still achieve the objectives of the invention. Such modifications are contemplated as within the scope of the claimed invention.

The invention claimed is:

1. A method, comprising:
   performing a device measurement by exciting a device using a current or a voltage and a frequency range;
   recording a response time record of said device measurement;
   determining time periods in said response time record exceeding a saturation level of a data acquisition system;
   discarding said time periods in said response time record which exceed said saturation level of said data acquisition system;
   discarding said time periods in a calibration time record;
   applying said calibration time record to said response time record of said device measurement; and
   generating a measure of said device.

2. The method of claim 1, further comprising:
   performing a shunt measurement with one non-inductive shunt value using said current or voltage and said frequency; and
   transforming said response time record of said shunt measurement to said frequency domain;
   normalizing said response time record of said shunt measurement to said one non-inductive shunt value; and
   recording said response time record of said shunt measurement transformed to said frequency domain and normalized to said non-inductive shunt value as a calibration time record.

3. The method of claim 2, further comprising:
   performing said shunt measurement with said one non-inductive shunt value using said current or voltage and each of a plurality of frequency ranges;

capturing said response time record of said shunt measurement including each of said plurality of frequency ranges;
transforming said response time record of said shunt measurement including each of said plurality of frequency ranges to said frequency domain;
normalizing said response time record of said shunt measurement including each of said plurality of frequency ranges transformed to said frequency domain to said one non-inductive shunt value;
recording said response time record of said shunt measurement including each of said plurality of frequency ranges transformed to said frequency domain and normalized to said non-inductive shunt value as a plurality of calibration time records;
performing said device measurement using one of said plurality of frequency ranges;
capturing said response time record of said device measurement using one of said plurality of frequency ranges;
transforming said response time record of said device measurement at said one of said plurality of frequency ranges;
selecting one of said plurality of calibration time records corresponding to said one of said plurality of frequencies used in said device measurement; and
applying said one of said plurality of calibration time records to said response time record of said device measurement.

4. The method of claim 3, wherein said plurality of frequency ranges comprise harmonic octave subsets of said frequency range.

5. The method of claim 4, wherein said harmonic octave subsets comprise exact harmonic octave subsets of said frequency range.

6. The method of claim 1, further comprising:
recording said response time record of said device measurement including a negative time period from time zero, said negative time period corresponding to a fraction of a period of said frequency; and
discarding said negative time portion of said response time record of said device measurement.

7. The method of claim 6, wherein said fraction of said period of said frequency comprises about ten percent of said period of said frequency.

8. The method of claim 1, further comprising:
determining time periods in said response time record of said device measurement which exceed a saturation level of a digitizer within a data acquisition system;
discarding said time periods in said response time record of said device measurement which exceed said saturation level of said digitizer;
discarding time periods in said calibration time record which correspond to said time periods discarded in said response time record of said device measurement; and
applying said calibration time record having said time periods discarded which exceed said saturation level of said digitizer to said time response record of said device measurement having said time periods discarded which exceed said saturation level of said digitizer.

9. The method of claim 1, further comprising:
performing said shunt measurement using only a high range current or voltage level; and
scaling said shunt measurement based on said shunt measurement using only said high range current or voltage level.

10. The method of claim 1, further comprising:
transforming said response time record of said device measurement to said frequency domain; and
normalizing said response time record of said device measurement transformed to said frequency domain.

11. The method of claim 1, wherein said current or said voltage comprises a root mean square current or voltage.

12. A method, comprising:
performing a device measurement by exciting a device using a current or a voltage and a frequency range;
recording a response time record of said device measurement;
applying a decimation rate to said response time record of said device measurement;
discarding time periods in said response time record by applying said decimation rate;
apply said decimation rate to said calibration time record;
discarding time periods in said calibration time record corresponding to said discarded time periods in said response time record;
applying said calibration time record having said discarded time periods to said response time record having said discarded time periods; and
generating a measure of said device.

13. The method of claim 12, further comprising:
performing a shunt measurement with one non-inductive shunt value using said current or voltage and said frequency range; and
recording a response time record of said shunt measurement as said calibration time record.

14. The method of claim 13, further comprising:
transforming said response time record of said shunt measurement to a frequency domain; and
normalizing said response time record of said shunt measurement transformed to said frequency domain to said one non-inductive shunt value.

15. The method of claim 14, further comprising:
transforming said response time record of said device measurement to said frequency domain; and
applying said calibration time record to said response time record.

16. The method of claim 12, further comprising:
determining time periods in said response time record exceeding a saturation level of a data acquisition system;
discarding said time periods in said response time record which exceed said saturation level of said data acquisition system; and
discarding said time periods in said calibration time record.

17. The method of claim 15, further comprising applying said decimation rate prior to discarding said time periods in said response time record of said device measurement exceeding said saturation level of said digitizer.

18. The method of claim 12, wherein said decimation rate comprises a factor in a range of 2 to 32.

19. The method of claim 12, wherein said decimation rate comprise a factor of 16.

20. The method of claim 12, wherein said current or said voltage and a frequency range comprises a root mean squared current or voltage and frequency.

* * * * *